United States Patent
Fukuda et al.

(10) Patent No.: US 6,418,640 B1
(45) Date of Patent: Jul. 16, 2002

(54) DRYING APPARATUS FOR A SUBSTRATE AND DRYING METHOD THEREOF

(75) Inventors: Hiroshi Fukuda, Odawara; Yoshitomo Yasuike, Yamanishi; Kazuhiko Gommori, Ninomiya-machi; Kunio Aburada, Odawara, all of (JP)

(73) Assignee: Hitachi Electronics Engineering Co., Ltd., Tokyo (JP)

( * ) Notice: Subject to any disclaimer, the term of this patent is extended or adjusted under 35 U.S.C. 154(b) by 0 days.

(21) Appl. No.: 09/579,134

(22) Filed: May 30, 2000

(30) Foreign Application Priority Data

May 31, 1999 (JP) .......................... 11-151379
May 11, 2000 (JP) ........................ 2000-139007

(51) Int. Cl.[7] ................................ F26B 3/00
(52) U.S. Cl. ............................ 34/510; 34/74
(58) Field of Search ..................... 34/74, 29, 571, 34/464, 510, 4; 427/372.2

(56) References Cited

U.S. PATENT DOCUMENTS

| 4,408,400 A | * 10/1983 | Colapinto ................. 34/4 |
| 4,779,355 A | * 10/1988 | Petros ..................... 34/464 |
| 5,068,977 A | * 12/1991 | Syopri et al. ............. 34/571 |
| 5,147,690 A | * 9/1992 | Faust et al. ............ 427/372.2 |
| 5,212,877 A | * 5/1993 | Onur et al. ................ 34/29 |
| 6,158,141 A | * 12/2000 | Asada et al. ............... 34/74 |

FOREIGN PATENT DOCUMENTS

| JP | 361008928 | * 1/1986 | ......... H01L/21/304 |
| JP | 362081718 | * 4/1987 | ......... H01L/21/304 |
| JP | 405036660 | * 2/1993 | ......... H01L/21/304 |
| JP | 407014819 | * 1/1995 | ........... F26B/15/12 |
| JP | 409090306 | * 4/1997 | ............. G02F/1/13 |
| JP | 2001050660 | * 2/2001 | ............. F26B/5/00 |

* cited by examiner

Primary Examiner—Teresa Walberg
Assistant Examiner—L Fastovsky
(74) Attorney, Agent, or Firm—Oblon, Spivak, McClelland, Maier & Neustadt, P.C.

(57) ABSTRACT

Thin substrate plates are transferred in a horizontal or tilted posture on and by a substrate transfer means. Provided by a substrate transfer path is an air knife nozzle for scraping and drying off a liquid successively from surfaces of the substrates on the substrate transfer means. The air knife nozzle is located substantially at a uniform distance across a drying surface of a substrate plate on the transfer means. The air knife nozzle is provided with a slit-like nozzle hole to spurt jet air to the drying surface from an angular direction relative to a direction perpendicular to the substrate transfer direction and to sweep the substrate across the entire width of the drying surface and with a predetermined angle of incidence relative to the substrate transfer direction. Further, an air augmenting means is located in face to face relation with a corner portion of the substrate which is finally swept by the air knife nozzle, for increasing an amount of jet air to purge a liquid which is gathered in the corner portion as a result of the sweeping action of the air jet nozzle.

9 Claims, 5 Drawing Sheets

DRYING APPARATUS FOR A SUBSTRATE AND DRYING METHOD THEREOF

BACKGROUND OF THE INVENTION

1. Field of the Art

This invention relates to an apparatus and a method for drying wet substrates, for example, of liquid crystal panels and the like by the use of air knife effects.

2. Prior Art

For instance, a TFT type LCD panel is basically constituted by a couple of rectangular glass substrate plates with a TFT layer and a color filter layer, respectively. In the fabrication of TFT substrates, a process which consists of formation of a resist film, exposure, development, etching, defoliation of the resist film etc. is cyclically repeated for a plural number of times. the substrates need to be washed and dried repeatedly before or after these processes. On the other hand, a color filter is formed on substrates by photolithography, which also requires to wash and dry the substrate in preparatory and interim stages of its process. Further, washing and drying operations are similarly required in the case of LCD panels other than the TFT type panels or in the case of other substrates in the form of rectangular glass or synthetic resin plates.

For drying washed substrates, there have been known various methods. Particularly, in order to successively wash and dry substrates which are transferred on a processing line, it is the general practice to use the so-called air knife effects for drying purposes. Drying by air knife is usually used in the manner as follows.

By a substrate transfer means, the substrates to be dried are transferred in a horizontal state or in a slightly tilted state toward a direction perpendicular to the direction in which the substrates are transferred. An air knife nozzle with a narrow slit-like mouth is located in a position along a transfer path of substrates in such a way that the nozzle mouth is directed toward the top side of the substrates. As each substrate on the substrate transfer means is brought to a position where it is confronted by the air knife nozzle, air jets of high pressure are blasted across the entire length of the substrate in a direction perpendicular to the direction of transfer. Upon impinging upon the substrate, high pressure air is caused to flow along the surface of the substrate, peeling or scraping liquid droplets or films off the substrate surface for drying same.

In this connection, it is usually the case that the air knife nozzle is arranged in such a way as to spurt jet air toward a substrate in a direction opposite to the substrate transfer direction by the substrate transfer means and with a shallow angle of incidence on the drying surface of the substrate, and the slit-like mouth of the air knife nozzle is located in the proximity of the drying surface of the substrate. Accordingly, an extremely thin foil of jet air is blasted on the drying surface of the substrate with a predetermined angle of incidence, urging a liquid on the drying surface to move in rearward directions by the jet air pressure and finally purging the liquid from rear edge portions of the substrate.

In the case of substrates which are rectangular in shape, for example, each substrate is placed on the substrate transfer means in such a way that the opposite longitudinal sides of the substrate lie in the substrate transfer direction. In order to remove a liquid smoothly in a reliable manner from the surface of a substrate which is being transferred in the way as just mentioned, it is desirable to locate an air knife nozzle in a plane parallel with the substrate on the transfer means and with a certain angle of inclination relative to a direction which is perpendicular to the substrate transfer direction. Most preferably, the air knife is set in a position which is inclined through 45 degrees. By so setting, a liquid which is subjected to jet air pressure is urged to move along the surface of a substrate not only in the substrate transfer direction but also in obliquely sideward directions depending upon the angle of inclination of the air knife nozzle. As a consequence, a liquid on the substrate can be purged from its rear end edges in the direction of the substrate transfer direction and from its side edges as well, making it possible to remove a liquid in a smooth and quick manner by shortening the distances of movement of the liquid to the purging edges.

The inclined installation of an air knife nozzle, however, causes a liquid on a substrate to concentrate toward corner portions of purging rear edges of the substrate. In this regard, since the pressure of jet air from the air knife nozzle acts uniformly across a substrate, it is often found difficult to remove completely a liquid which has concentrated in corner portions of the substrate, especially in case the deposition rate of liquid on substrate surfaces is large. If, due to incomplete dissipation, substrates which still bear liquid residues in corner portion are transferred to a next stage of a fabrication process, the residual liquid may be forced to flow back onto the substrate surfaces by vibrations in the course of the transfer and may contaminate the substrates, leaving stains on the substrate surfaces. Besides, liquid residues in corner portions of substrates may deposit on the transfer means. The path of transfer by the substrate transfer means should be kept perfectly in a dry state because deposition of liquid on the transfer means may give rise to stains or other contaminations on the surfaces of following substrates.

On the other hand, for drying substrates, an air knife which is used in the drying stage is located within a drying chamber for the purpose of preventing redeposition of droplets or mist of dissipated liquids. In addition, it is necessary to make sure that two of the substrate will not simultaneously come into a blasting area of the air knife nozzle. If the above-mentioned inclination angle of the air knife nozzle is increased for the purpose of accelerating liquid dissipation, it will become necessary to broaden the intervals of the substrates on the transfer means and to provide a larger chamber in the drying stage.

In view of the foregoing situations, although the inclination angle of an air knife is preferred to be set at 45 degrees from the standpoint of drying efficiency, actually there often arises a necessity for reducing the inclination angle of the air knife nozzle, more specifically, for installing the air knife nozzle almost at right angles in order to reduce the drying chamber in size and to shorten the intervals between the individual substrates in transfer. In such cases, a liquid tends to move along lateral side edges of substrates in the transfer direction and to concentrate in corner portions of the substrates instead of being dissipated therefrom, making its removal more difficult.

SUMMARY OF THE INVENTION

In view of the difficulties as discussed above, it is an object of the present invention to provide a method and an apparatus for drying substrate plates efficiently and completely including corner portions of the substrates in a drying stage which is equipped with an air knife nozzle.

It is another object of the present invention to provide a method and an apparatus which permit to downsize a chamber of a drying stage and to narrow the intervals between individual substrate plates being conveyed by a transfer means, and yet make it possible to dry the surfaces of the respective substrates completely.

It is still another object of the present invention to a method and an apparatus which can purge a liquid in a reliable manner from corner portions of substrate plates where a liquid tends to concentrate when swept by jet air from an air knife nozzle which is disposed at a smaller angle of inclination.

According to the present invention, for achieving the above-stated objectives, there is provided an apparatus for drying substrate plates, which comprises: a substrate transfer means adapted to transfer washed thin substrate plates forward in a horizontal posture or in a predetermined tilted posture; an air knife nozzle located in a predetermined position by a path of transfer of the substrate transfer means to blast away and dry off a wash liquid remaining on surfaces of each substrate plate on the substrate transfer means; the air knife nozzle having a slit-like nozzle mouth located substantially at a uniform distance across a width of a drying surface of the substrate and disposed at a predetermined angle with a transverse direction perpendicular to the substrate transfer direction to spurt jet air across entire width of the substrate in a direction opposite to the substrate transfer direction and with a predetermined angle of incidence; and jet air augmenting means for increasing an amount of jet air to be blasted on and around a corner portion of the substrate which is finally swept by the air knife nozzle and to which a wash liquid on the drying surface is gathered by jet air from the air knife nozzle.

As for the air augmenting means, it may be constituted by an auxiliary jet air nozzle located face to face with the corner portion of the substrate which is finally swept by the air knife nozzle, and adapted to spurt liquid purge air toward the corner portion in the wake of the air knife nozzle. In this regard the auxiliary jet air nozzle may be adapted to start spurting liquid purge air toward the corner portion of the substrate at a time point when the corner portion comes to a confronting position, or adapted to spurt liquid purge air continuously toward the corner portion of the substrate. From the standpoint of accuracy of drying operation, it is preferable to control the auxiliary jet air nozzle to start spurting jet air at a time point when a corner portion of a substrate is advanced to a face-to-face confronting position. Further, the auxiliary jet air nozzle which serves to spurt jet air exclusively to one corner portion of each substrate suffices to be short in length, so that, even if located at a large angle relative to a direction perpendicular to a substrate transfer direction, it will affect the size of drying chamber and the intervals of substrate plates on the substrate transfer means. Accordingly, as compared with the air knife nozzle, it is preferable to set the auxiliary jet air nozzle at a greater inclination angle relative to a direction perpendicular to the substrate transfer direction. Liquid can be purged from a corner portion of a substrate in a more assured manner in case the incident angle of jet air from the auxiliary jet air nozzle is greater than that of jet air from the air knife nozzle.

For example, the above-mentioned substrates are thin synthetic resin or metal plates of square or rectangular shape. In case of rectangular plates, the substrates are placed on the substrate transfer means with the respective longitudinal sides of the plates in the transfer direction. In this connection, a roller conveyer or a belt conveyer can be suitably employed as the substrate transfer means. The substrates may be transferred either in a horizontal state or in a tilted state having one longitudinal or lateral side inclined upward or downward. In the case of the transfer in a tilted state, a liquid on the surface of a substrate is urged to flow along the sloped surface and therefore droplets of a liquid can be removed before sweeping the substrate surface with jet air from the air knife nozzle, enhancing the drying efficiency all the more.

As for another example of the air augmenting means, the air knife nozzle itself can be made to function as an air augmenting means. More particularly, the transfer speed by the substrate transfer means may be slowed down or the substrate transfer means may be stopped temporarily when the air knife nozzle comes face to face with a rear end corner portion of a substrate, which is finally swept by jet air from the air knife nozzle. By slowing down or stopping the substrate transfer means, an increased amount of air is blasted in the final corner portion of the substrate. For this purpose, the air augmenting means may be constituted by a substrate position detection means adapted to detect position of a substrate advancing on the substrate transfer means, and a control means, and a control means adapted to slow down the transfer speed or to temporarily stop the substrate transfer means when the substrate is detected by the substrate position detection means to have come to a point immediately upstream of a face-to-face position with the air knife nozzle.

Further, according to the present invention, there is provided a method for drying washed substrates by blasting jet air successively on surfaces of the substrates from an angular direction while being transferred by a substrate transfer means, characterized in that the method comprises the steps of: sweeping a drying surface of a substrate on the substrate transfer means with jet air from an air knife nozzle located substantially at uniform distance across a width of the substrate and adapted to bombard the jet air from an angular direction and with a predetermined angle of incidence in a substrate transfer direction thereby to scrape and dry off a liquid from surfaces of the substrate; and augmenting an amount of jet air when coming to a comer portion of the substrate from which a liquid is finally purged.

According to a modified form of the present invention, there is provided a method for drying washed substrates by blasting jet air successively on surfaces of the substrates from an angular direction while being transferred by a substrate transfer means, characterized in that the method comprises the steps of: sweeping a drying surface of a substrate on the substrate transfer means with jet air from an air knife nozzle located substantially at a uniform distance across a width of the substrate and adapted to bombard the jet air from an angular direction and with a predetermined angle of incidence in a substrate transfer direction thereby to scrape and dry off a liquid from surfaces of the substrate; and blasting a predetermined amount of liquid purge air to a comer portion of the substrate from an auxiliary jet air nozzle tufter the corner portion has been swept by jet air from the air knife nozzle.

The above and other objects, features and advantages of the present invention will become apparent from the following particular description of the invention, taken in conjunction with the accompanying drawings which show by way of example some preferred embodiments of the invention.

DESCRIPTION OF PREFERRED EMBODIMENTS

Figure 1:
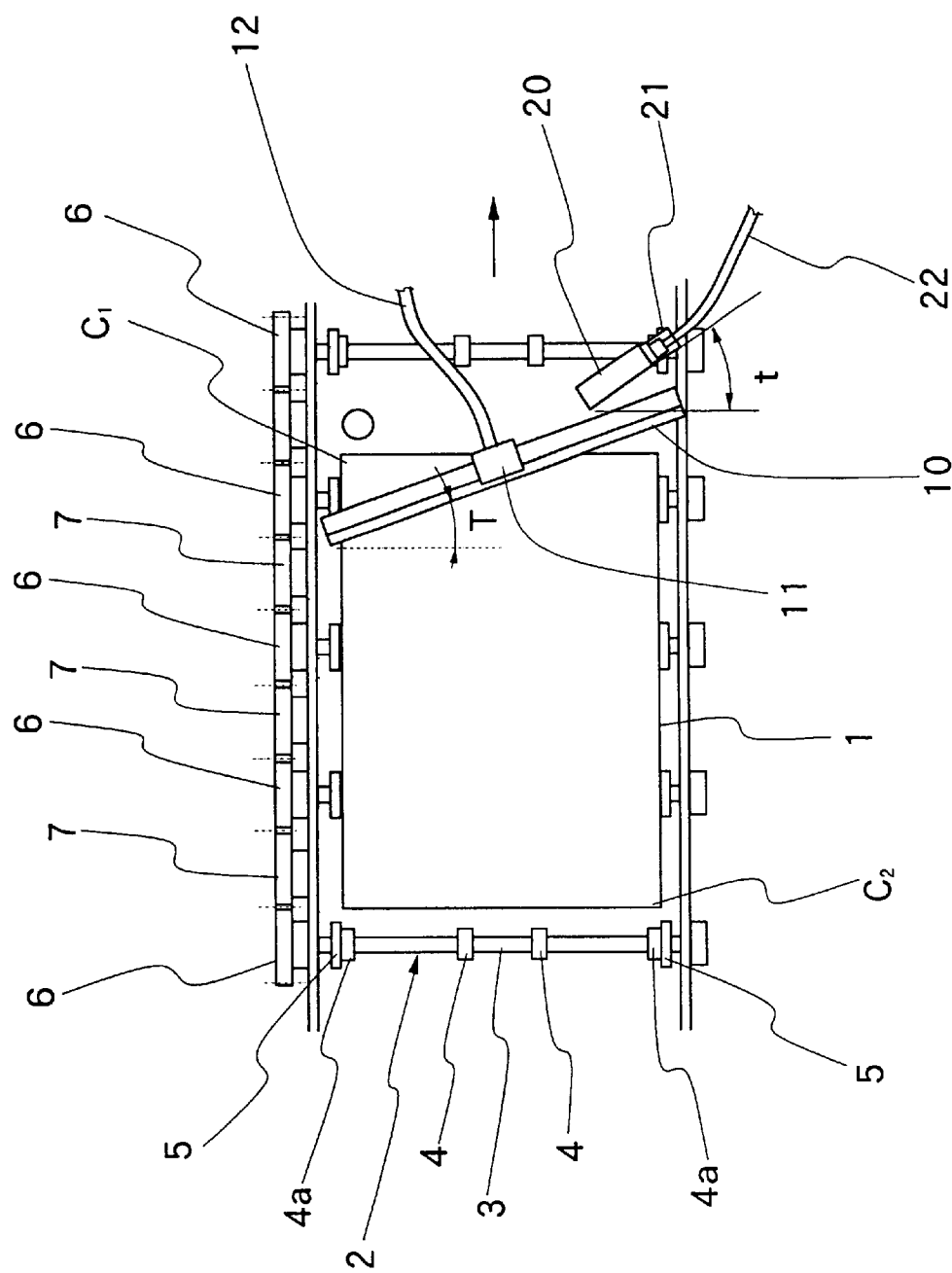
FIG. 1 is a schematic plan view of an embodiment of the apparatus for drying LCD panel substrates according to the present invention.
Figure 2:
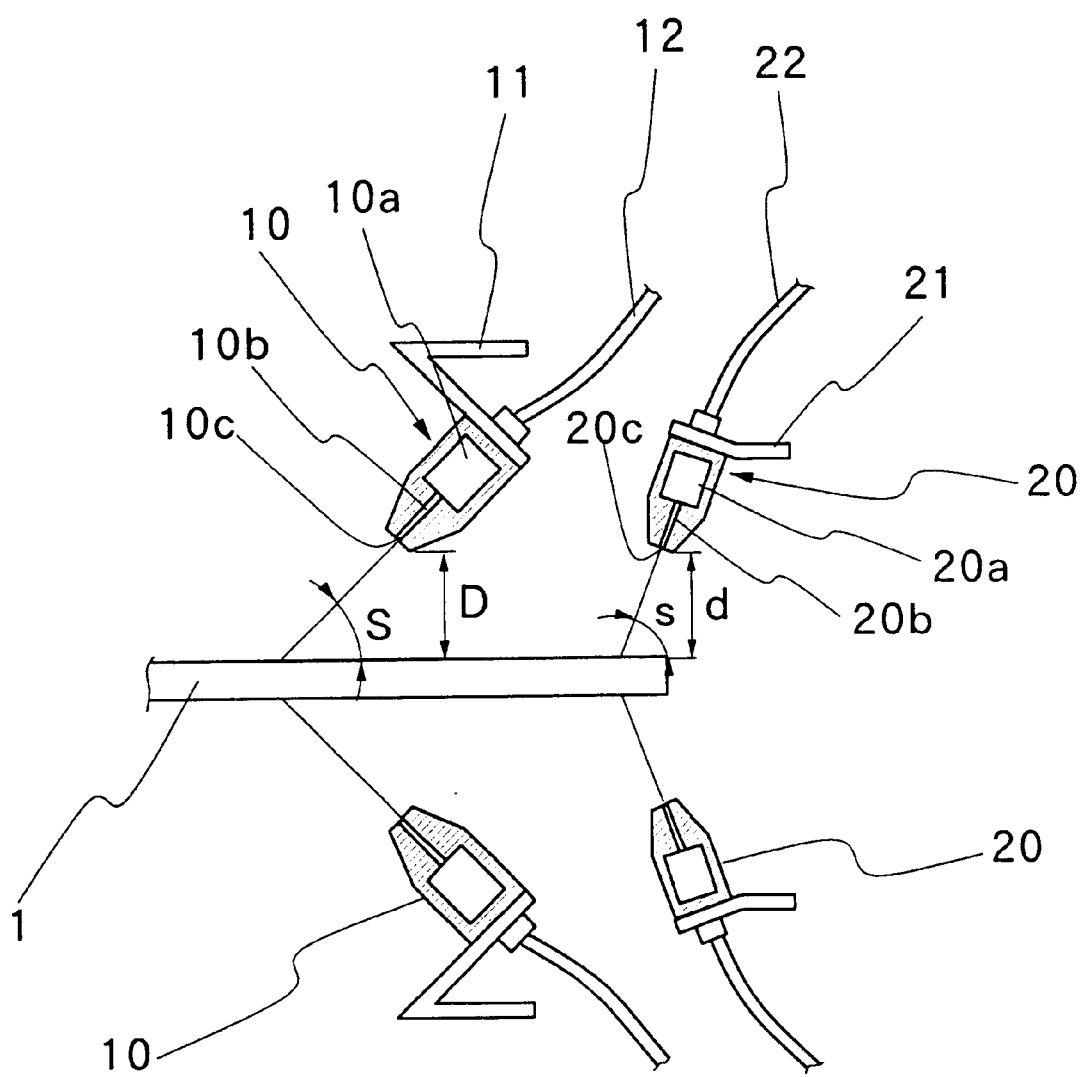
FIG. 2 is a schematic sectional view of an air knife nozzle and an auxiliary jet nozzle.

Hereafter, the present invention is described more particularly by way of its preferred embodiments shown in the accompanying drawings. Firstly, shown at 1 in FIGS. 1 and 2 is a substrate which in the form of a rectangular glass plate like an LCD panel substrate. Indicated at 2 is a roller conveyer which is adopted as a substrate transfer means and constituted by a number of rotational shafts 3, which are located at predetermined intervals and are each provided with a plural number of rollers 4 in the longitudinal direction thereof. Of the rollers 4, end rollers 4a at the opposite ends of the rotational shaft 3 are each provided with a flange portion 5.

Each substrate 1 which is in the form of a thin rectangular plate is placed flat on the roller conveyer 2, and thereby transferred horizontally in the direction indicated by an arrow in FIG. 1, with the opposite side edges in abutting engagement with the flange portions 5 of the rollers 4. For driving the roller conveyer 2, a gear 6 is mounted on one end of each rotational shaft 3. The gear 6 of each rotational shaft 3 is meshed with a gear or gears of adjacent rotational shafts 3 through a transmission gear 7. Therefore, upon driving a gear 6 of one rotational shaft 3, all of the rotational shafts 3 are put in rotation at a uniform speed. Although omitted in the drawings, substrates 1 are washed beforehand with a wash liquid which is fed toward the top or lower side of the substrates from a shower or a washing nozzle in a washing stage, which is provided adjacently on the upstream side of the roller conveyer 2. The substrates which come out of the washing stage are then transferred to a drying stage by the roller conveyer 2.

In the drying stage, elongated air knife nozzles 10 are located across the path of transfer of the substrates 1 or across the roller conveyer 2. As shown particularly in FIG. 2, an air knife nozzle 10 is provided on each side of the substrate 1, one in face to face relation with the top side and the other in face to face relation with the lower side of the substrate 1 to dry up both sides of the substrate 1 simultaneously. The upper and lower air knife nozzles 10 are supported by brackets 11 and at position which will not interfere with the transfer of substrates 1 by the roller conveyer 2. Each air knife nozzle 10 is internally formed with a pressurizing chamber 10a, and a slit-like passage 10b which is extended axially forward from the pressurizing chamber 10a to provide a nozzle hole 10c at its fore end. Connected to each air knife nozzle 10 is an air conduit 12 which supplies pressurized clean air to the pressurizing air chamber 10a.

From the air knife nozzles 10 which are arranged in the manner as described above, jet air is blasted on the top and lower sides of the substrate 1 from a predetermined angular direction. The slit-like nozzle hole 10c of each air knife nozzle 10 on each side of the substrate transfer path is extended across the entire width of the substrate 1 and retained at a uniform distance D from the top or lower surface of the substrate 1 along the entire length thereof. Air within the air knife nozzle 10 is rectified into thin streams by the slit-like passage 10c and spurted out from the nozzle hole or slit 10c. Accordingly, the angle of incidence of jet air on a drying surface of the substrate 1 corresponds to the angle of the slit-like passage 10c with the arying surface of the substrate 1. Air is blasted from a direction which is opposite to the substrate transfer direction, and an acute angle of incidence S. The angle of incidence S can be adjusted by varying the elevation angle of the air knife nozzle 10 relative to the substrate 1. The air knife nozzle 10 which is adjusted in elevation angle in this manner is supported on the bracket 11, so that jet air from the air knife nozzles 10 is blasted on the substrate 1 at a suitable angle for peeling off a liquid from surfaces of the substrate 1 in a secure manner and pushing a liquid away along surfaces of the substrate 1 in a stabilized state free of back splashing.

The air knife nozzles 10 are each located in a plane which is parallel with the substrate 1, but inclined by a predetermined angle from a direction which transversely intersects the substrate transfer direction. More specifically, the air knife nozzles 10 are each inclined into an angular position by a predetermined angle T (FIG. 1). Therefore, as indicated by arrows in FIG. 3, air flows along the surfaces of the substrate 1 in obliquely diagonal directions relative to the substrate transfer direction. As a result, while a substrate 1 is being transferred forward by the roller conveyer 2, the jet air from the air knife nozzle 10 is initially blasted on a corner portion $C_1$ of the drying surface of the substrate 1, i.e., an initial touch-down position where jet air initiates sweeping of the drying surface of the substrate 1. On the other hand, the jet air from the air knife nozzle 10 leaves the substrate 1 at a diagonally opposite corner portion $C_2$, which is finally swept by jet air from the substrate 1.

Indicated at 20 are auxiliary jet air nozzles which are supported on brackets 21 separately from the air knife nozzles 10. An air supply conduit 22 is connected to each auxiliary jet air nozzle 20. Substantially in the same manner as the air knife nozzles 10, the auxiliary jet air nozzles 20 are provided with a pressurizing air chamber 20a, slit-like passage 20b and nozzle hole 20 in communication with an air supply conduit 22. However, each one of these auxiliary jet air nozzles 20 serves as an air augmenting means to blast jet air toward the corner portion $C_2$ of the substrate 1 at the above-mentioned take-off position. Accordingly, the auxiliary jet air nozzles 20 are located in a position on or near a locus of movement of the corner portion $C_2$ or the air disengaging position of the substrate 1 in the substrate transfer direction of the roller conveyer 2, and are conspicuously shorter in length as compared with the air knife nozzles 10.

Figure 3:
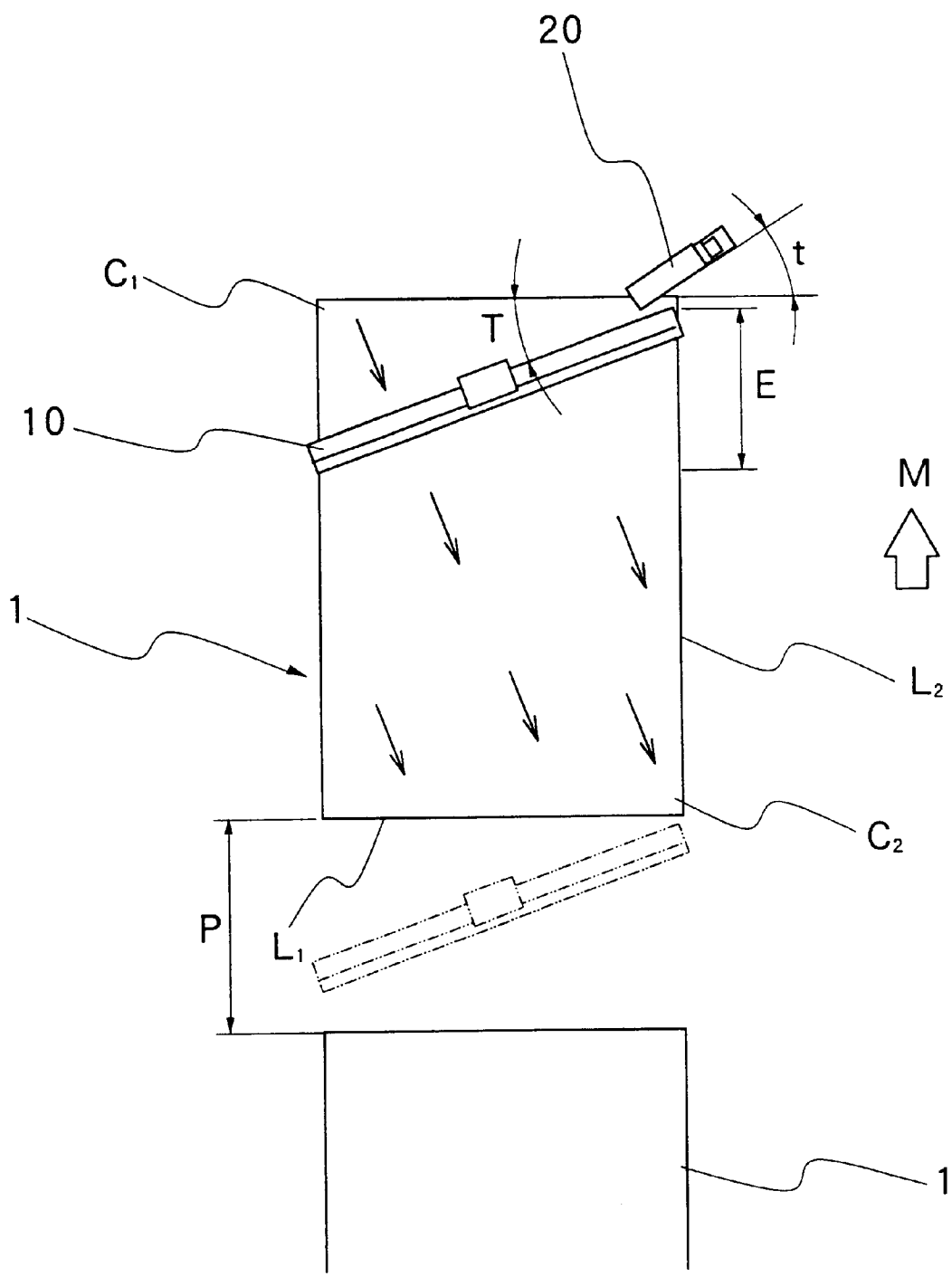
FIG. 3 is a schematic illustration explanatory of acting directions of jet air blasted on the surface of a substrate.

Now, in FIG. 3, a liquid is pushed away along the surface of the substrate 1 by jet air which start sweeping from the above-mentioned initial touch-down point at the corner $C_1$ of the substrate 1, and urged to flow in an oblique direction due to and depending upon the inclination angle of the air knife nozzle 1, and finally purged from the substrate at rear end edge $L_1$ and side edge $L_2$. In this regard, the angle T of the air knife nozzle 10 is increased in order to augment the liquid flow toward the side edge $L_2$ of the substrate 1. However, the greater the angle T, the longer becomes the total length of the nozzle hole 10c of the air knife nozzle 10.

Besides, it becomes necessary for the air knife nozzle 10 to be arranged not to act on two adjacently located substrates 1 simultaneously. This is because, if the air knife nozzle 10 happens to act on two adjacently located substrates 1, splashes of a liquid from a preceding substrate 1 are very likely to fall and deposit on dried areas of a succeeding substrate 1. Therefore, in case the inclination angle T of the air knife nozzle 10 is increased, the intervals P between the respective substrates 1 in transfer have to be broadened correspondingly. Further, from the standpoint of making a drying stage compact, it is advantageous to narrow the width of an air blast area E in the substrate transfer direction as much as possible.

For the reasons as stated above, restrictions are normally imposed on the inclination angle of the air knife nozzle 10. Accordingly, the inclination angle T of the air knife nozzles 10 is determined, taking into consideration the drying efficiency, downsizing of the air knife nozzles 10 and compactness of the drying stage, for example, in the range between 15 degrees to 30 degrees, and, preferably set at an angle of about 20 degrees. In order to dry the substrates 1 completely, distance D between the air knife nozzle 10 and the substrate 1 and angle of incidence S of jet air on the substrate 1 are determined along with the inclination angle T of the air knife nozzle 10. Namely, on the basis of a predetermined or preset angle of inclination T. the distance D and the angle of incidence S are set at such values as will ensure complete drying of the substrates 1 by jet air. In this regard, the distance D and the angle of incidence S are varied depending upon the amount of jet air and surface conditions of the substrates 1, but normally the air knife nozzles 10 are preferred to be set at a distance of several millimeters in the interval distance D and at an angle of 30 to 50 degrees in the angle of incidence S.

Figure 4:
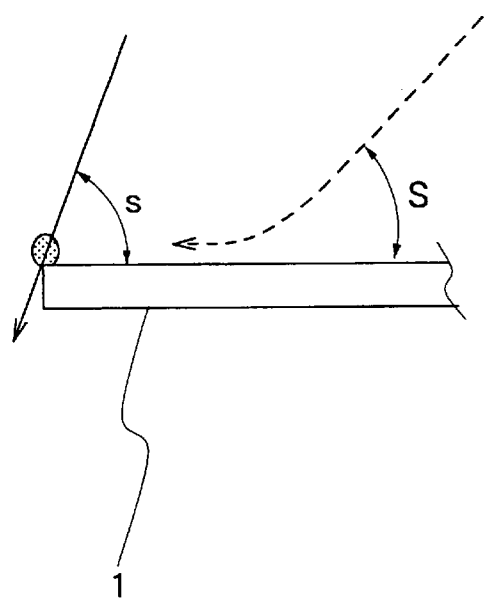
FIG. 4 is a schematic illustration explanatory of an operational phase of drying a substrate surface by the air knife nozzle and an operational phase of purging liquids from corner portions of the substrate by the auxiliary jet nozzle.

On the other hand, each one of the auxiliary jet air nozzles 20 is provided for purging a liquid which has been collected at or in the vicinity of the corner portion $C_2$ either on the top or lower side of the substrate 1, and not for pushing a liquid along the surface of the substrate 1. The auxiliary jet air nozzle hole 20c is far shorter than that of the air knife nozzle 10 in length, so that it is not subject to any restrictions in particular on inclination angle t in constructing the apparatus. Therefore, the inclination angle t of the auxiliary jet air nozzle 20 may be set at a value which will be more effective in purging a liquid. More specifically, for example, the auxiliary jet air nozzle 20 is set at a greater inclination angle t as compared with the inclination angle T of the air knife nozzle 10, for example, at an inclination angle t of 30 to 45 degrees. Besides, in contrast to the jet air from the air knife nozzle 10 which acts to push a liquid along the surface of a substrate 1 as indicated by a broken line in FIG. 4, the jet air from the auxiliary jet air nozzle acts to peel off a liquid from edges of the corner portion $C_2$ of the substrate 1 as indicated by a solid line in the same figure. Namely, the angle of incidence s on the substrate 1 of jet air from the auxiliary jet air nozzle 20 is made larger than the angle of incidence S of jet air from the air knife nozzle 10. The angle of incidence s is larger than 45 degrees and preferably in the range of 60 to 80 degrees. Further, each one of the auxiliary jet air nozzles 20 is located at a distance d, which need not be differentiated from the above-mentioned distance D of the air knife nozzle 10 from the substrate 1.

Now, described below is a method of drying substrates 1 by the use of the above-described substrate drying apparatus according to the present invention. Before reaching the drying stage, the substrates 1 on the roller conveyer 2 are washed through a shower or downpour of a wash liquid. At the drying stage, high pressure jet air is spurted out from the air knife nozzles 10 to peel off the wash liquid which remains on the surface of substrates 1 which come into the drying stage one after another.

At this time, for example, in a case where a substrate 1 is transferred in the direction of arrow M as shown in FIG. 3, the jet air form the air knife nozzle 10 is firstly landed on the corner portion $C_1$ at the leading end of the substrate 1 and a blast area is gradually shifted over the entire surface of the substrate 1 in step with the movement of the substrate 1. As a consequence, a wash liquid which remains on the surface of the substrate 1 is pushed back by air pressure in a direction opposite to the substrate transfer direction, more specifically, due to the angular disposition of the air knife nozzle 10 having the inclination angle T, pushed back in obliquely rearward directions as indicated by arrows in FIG. 3 and purged from rear end edge portions $L_1$ and lateral side edge portions $L_2$ of the substrate 1. Thus, the wash liquid on the surface of the substrate 1 is removed in an extremely speedy and efficient manner to dry the substrates 1 successively as they pass the air knife nozzles 10.

By advancement of the substrates 1 on the roller conveyer 2, each air knife nozzle 10 is successively brought into and out of engagement with the respective substrates 1 to strip a wash liquid on the substrate surfaces. By the time when the air knife nozzle 10 is disengaged at the corner portion $C_2$ of each substrate 1, the wash liquid has been pushed toward and concentrated in the corner portion $C_2$ by the action of jet air from the air knife nozzle 10. Therefore, it may become difficult to completely remove the wash liquid which has been concentrated in the corner portion $C_2$ of the substrate 1, if jet air of constant pressure is spurted out from the air knife nozzle 10 continuously until it is disengaged at the corner portion $C_2$. However, from the auxiliary jet air nozzle 20 which is positioned face to face with the corner portion $C_2$ of the substrate 1, jet air is blasted on the corner portion $C_2$ in a zone between a point immediately upstream of a position where the auxiliary jet air nozzle 20 comes face to face with the corner portion $C_2$ and a point where the air knife nozzle 10 has already been disengaged from the corner portion $C_2$. Consequently, the amount of jet air toward the corner portion $C_2$ increased for complete purge of the gathered wash liquid in the corner portion $C_2$ which would otherwise be extremely difficult. Besides, since the inclination angle, the angle of incidence of jet air and the distance of each auxiliary jet air nozzle 20 are so determined as to make a final purge of a liquid independently of the air knife nozzle 10, it can completely purge the liquid which gathers in the corner portion $C_2$ to send the substrate 1 forward in a completely dry state entirely free of the wash liquid.

In this regard, the auxiliary jet air nozzle 20 may be arranged to spurt jet air continuously if desired. However, for high-level or sophisticated drying, it is desirable to control each auxiliary jet air nozzle 20 to spurt jet air only in a predetermined zone across the corner portion C2 of each substrate 1, i.e., from point immediately upstream of a position where the auxiliary jet air nozzle 20 comes face to face with the corner portion C2 to a point where it is completely disengaged from the substrate 1. This because most surface areas of the substrate 1 are already dried by the air knife nozzle 10 which precedes the auxiliary jet air nozzle 20, and blasting of jet air on once-dried surface areas could give rise to a slight degree of unevenness to dried surfaces. Even if in a slight degree, unevenness in dried conditions is impermissible in view of the recent trends toward fine-pitch LCD panels.

Accordingly, in order to control the auxiliary jet air nozzle 20 to spurt jet air at a time point when the corner portion C2 of each substrate 1 comes face to face therewith, it is necessary to detect the position of the substrates 1 on the roller conveyer 2. For this purpose, as shown in FIG. 1, a passage sensor 23, either in the form of a non-contacting type sensor such as photo-sensor, magnetic sensor, ultrasound sensor or the like or a contacting type sensor such as displacement sensor or load sensor using a roller or a tactile sensor, is located in a predetermined position or check point alongside the path of transfer of the substrates 1 to spurt jet air from the auxiliary jet air nozzle 20 when a substrate 1 passes the check point.

Of course, jet air may be spurted from the auxiliary nozzle 20 continuously in a case where a slight degree of unevenness in dried surface conditions as mentioned above is permissible. With regard to unevenness in dried surface conditions, since jet air from the auxiliary nozzle 20 is biased on the substrates 1 after passing the air knife nozzle 10, it is often the case that a certain degree of unevenness remains in the comer portions $C_2$. However, this sort of unevenness in dryness can be ignored because the corner portions $C_2$ are outside an effective image display area of LCD panels.

Instead of providing the auxiliary jet air nozzles 20 described above, an increased amount of jet air can be directed toward the corner portions of the substrates by slowing down the substrate transfer speed of the roller conveyer at a predetermined position.

Figure 5:
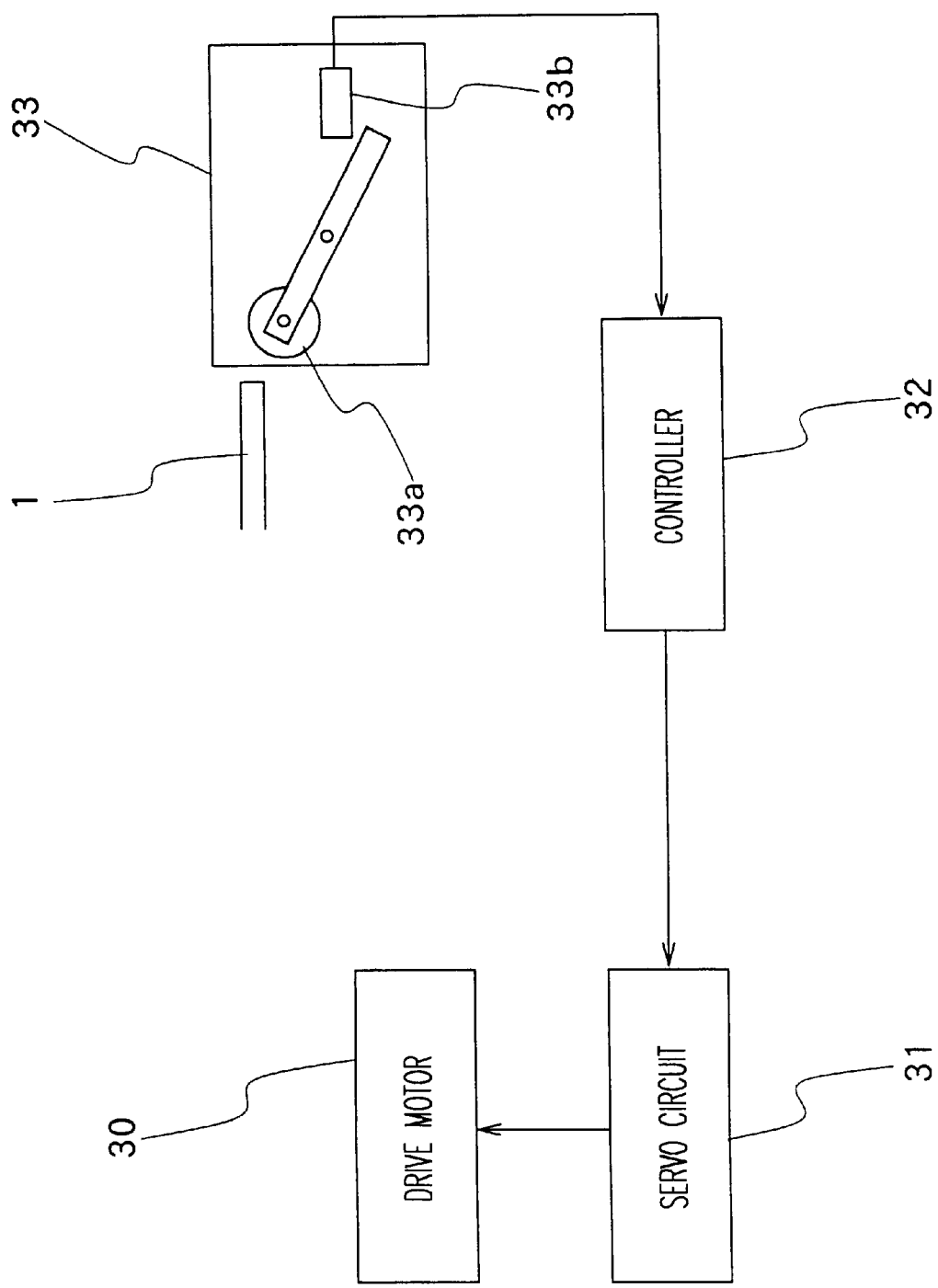
FIG. 5 is a schematic illustration explanatory of a variable transfer speed control employed for a substrate transfer system in a second embodiment of the present invention.

For instance, as shown in FIG. 5, a drive motor 30 such as an electric motor or the like can be employed as a drive means for the roller conveyer 2. More specifically, the drive motor 30 is connected to a servo circuit 31, for controlling the transfer speed of the roller conveyer 2 according to signals from a control means 32. Provided alongside the substrate transfer path of the roller conveyer 2 and on the upstream side of the air knife nozzles 10 is a substrate position detection means 33 consisting of a detector roller 33*a* which functions to detect passage of a substrate 1, and a sensor 33*b* which functions to detect an upward or downward movement of the roller 33*a*.

When a substrate 1 rides over the roller 33*a*, the latter sinks down under the weight of the substrate 1 and returns to an upper normal position as soon as taken over by and relieved of the weight of the substrate 1. This movement of the roller 33*a* is detected by the sensor 33*b*. Namely, passage of the substrate 1 is detected and confirmed at a time point when the roller 33*a* rises to an upper normal position. In addition, the position where passage of the substrate 1 is detected by the substrate position detection means 33 is so determined as to correspond to a point immediately upstream of a position where the comer portion $C_2$ of the substrate 1 passes the air knife nozzle 10.

As soon as passage of a substrate 1 is detected by the substrate position detection means 33, a detection signal is fed to the control means 32, and a command signal is fed to the servo circuit 31 from the control means 32 to slow down the drive motor 30 for a predetermined time period. As a consequence, the substrate transfer speed of the roller conveyer is slowed down from a point immediately before the air knife nozzle 10 starting to blast jet air toward the corner portion $C_2$ of the substrate 1 thereby to substantially increase the amount of jet air toward the comer portion $C_2$. Alternatively, while blasting jet air continuously, the substrate 1 may be stopped for a predetermined time length. Consequently, a wash liquid which has gathered in the comer portion C2 of the substrate 1 can be removed in an accelerated manner and completely purged from the substrate 1.

Figure 6:
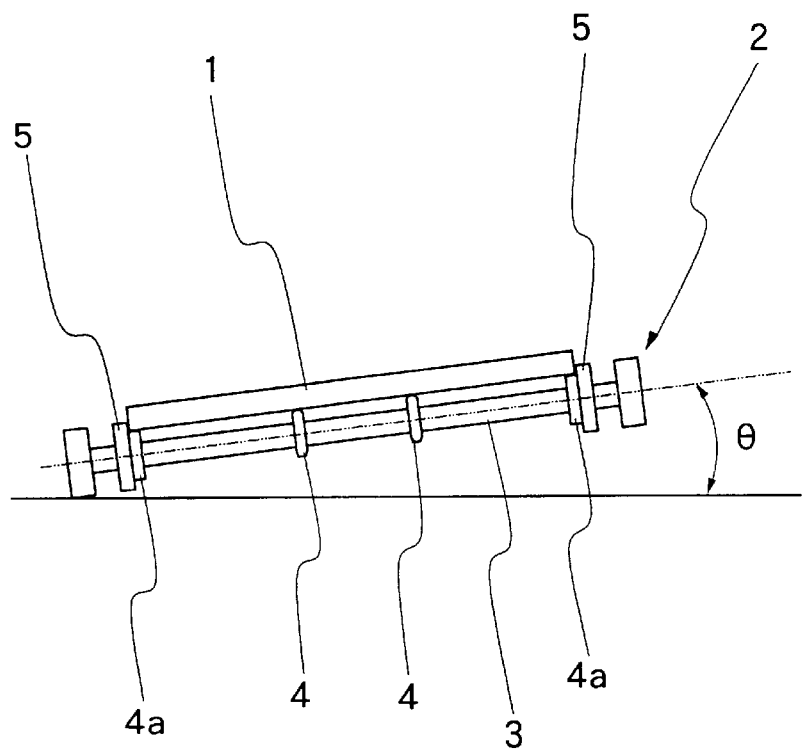
FIG. 6 is a schematic illustration showing another example of the substrate transfer system.

Instead of transferring substrates 1 in a horizontal state, if desired the roller conveyer 1 may be arranged to transfer substrates 1 in a laterally inclined state as shown in FIG. 6. For this purpose, the axes of the rotational shafts 3 of the roller conveyer 2 are inclined to one side by a predetermined angle, for example, by an angle of 5 to 10 degrees. By arranging the roller conveyer 2 in this manner, one lateral side, for example, the lateral side $L_2$ of each substrate on the conveyer can be inclined downward as shown in the drawing. In this case, the air knife nozzles 10 as well as the auxiliary jet air nozzles 20 are likewise inclined to have the respective nozzle mouths in parallel relation with the roller conveyer 2, that is to say, in parallel relation with the substrates 1 on the roller conveyer 2. In this case, the air knife nozzle 1 is directed toward the rising lateral side L2 of the substrate 1 from a position which is angularly shifted in the substrate transfer direction. When so arranged, a wash liquid on the substrate 1 is urged to flow toward the side edge L2 along the sloped surface and can be purged from the substrate in a more favorable manner.

What is claimed is:

1. An apparatus for drying substrates, comprising:
   a substrate transfer means adapted to transfer washed thin substrate plates forward in a horizontal posture or in a predetermined tilted posture;
   an air knife nozzle located in a predetermined position by a path of transfer of said substrate transfer means to blast away and dry off a wash liquid remaining on surfaces of each substrate plate on said substrate transfer means;
   said air knife nozzle having a slit-like nozzle mouth located substantially at a uniform distance across a width of a drying surface of said substrate and disposed at a predetermined angle with respect to a transverse direction perpendicular to said substrate transfer direction to spurt jet air across entire width of said substrate transfer direction to spurt jet air across entire width of said substrate in a direction opposite to said substrate transfer direction and with a predetermined angle of incidence; and
   an auxiliary jet air nozzle located face to face with a corner portion of said substrate finally swept by said air knife nozzle and adapted to spurt liquid purge air toward said comer portion in the wake of said air knife nozzle.

2. An apparatus for drying substrates as defined in claim 1, wherein said auxiliary air nozzle is adapted to start spurting liquid purge air toward said corner of said substrate at a time point when said corner portion comes to a confronting position.

3. A apparatus for drying substrates as defined in claim 1, wherein said auxiliary jet air nozzle is located at a larger angle than said air knife nozzle relative to a transverse direction perpendicular to said substrate transfer direction.

4. An apparatus for drying substrates as defined in claim 1, wherein said auxiliary jet air nozzle is adapted to spurt jet air on said substrate at a greater angle of incidence than said air knife nozzle.

5. A apparatus for drying substrates as defined in claim 1, wherein said air knife nozzle is disposed at a predetermined angle with respect to a transverse direction perpendicular to said substrate transfer direction which is not parallel to said traverse direction, as viewed in a vertical direction.

6. An apparatus for drying substrates, comprising:
   a substrate transfer means adapted to transfer washed thin substrate plates forward in a horizontal posture or in a predetermined tilted posture;

an air knife nozzle located in a predetermined position by a path of transfer of said substrate transfer means to blast away and dry off a wash liquid remaining on surfaces of each substrate plate on said substrate transfer means;

said air knife nozzle having a slit-like nozzle mouth located substantially at a uniform distance across a width of a drying surface of said substrate and disposed at a predetermined angle with respect to a transverse direction perpendicular to said substrate transfer direction to spurt jet air across entire width of said substrate in a direction opposite to said substrate transfer direction and with a predetermined angle of incidence;

a substrate position detection means adapted to detect position of a substrate advancing on said substrate transfer means; and a control means adapted to slow down transfer speed of said substrate transfer means when said substrate is detected by said substrate position detection means to have come to a point immediately upstream of face-to-face position with respect to said air knife nozzle.

7. A apparatus for drying substrates as defined in claim 6, wherein said air knife nozzle is disposed at a predetermined angle with respect to a transverse direction perpendicular to said substrate transfer direction which is not parallel to said traverse direction, as viewed in a vertical direction.

8. An apparatus for drying substrates, comprising:

a substrate transfer means adapted to transfer washed thin substrate plates forward in a horizontal posture or in a predetermined tilted posture;

an air knife nozzle located in a predetermined position by a path of transfer of said substrate transfer means to blast away and dry off a wash liquid remaining on surfaces of each substrate plate on said substrate transfer means;

said air knife nozzle having a slit-like nozzle mouth located substantially at a uniform distance across a width of a drying surface of said substrate and disposed at a predetermined angle with respect to a transverse direction perpendicular to said substrate transfer direction to spurt jet air across entire width of said substrate in a direction opposite to said substrate transfer direction and with a predetermined angle of incidence;

a substrate position detecting means adapted to detect position of a substrate advancing on said substrate transfer means; and a control means adapted to stop advancing movement of said substrate on said substrate transfer means for a predetermined time period when said substrate is detected by said substrate position detection means to have come to a point immediately upstream of a face-to-face position with respect to said air knife nozzle.

9. A apparatus for drying substrates as defined in claim 8, wherein said air knife nozzle is disposed at a predetermined angle with respect to a transverse direction perpendicular to said substrate transfer direction which is not parallel to said traverse direction, as viewed in a vertical direction.

* * * * *